United States Patent
Enichlmair et al.

(10) Patent No.: US 8,383,488 B2
(45) Date of Patent: Feb. 26, 2013

(54) METHOD FOR PRODUCING A SEMICONDUCTOR COMPONENT WITH TWO TRENCHES

(75) Inventors: Hubert Enichlmair, Graz (AT); Martin Schrems, Eggersdorf (AT); Franz Schrank, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 717 days.

(21) Appl. No.: 12/515,224

(22) PCT Filed: Oct. 22, 2007

(86) PCT No.: PCT/EP2007/061275
§ 371 (c)(1), (2), (4) Date: Jan. 12, 2010

(87) PCT Pub. No.: WO2008/058829
PCT Pub. Date: May 22, 2008

(65) Prior Publication Data
US 2010/0144114 A1 Jun. 10, 2010

(30) Foreign Application Priority Data
Nov. 17, 2006 (DE) .................. 10 2006 054 334 U

(51) Int. Cl.
H01L 21/76 (2006.01)
(52) U.S. Cl. .............. 438/424; 438/427; 438/430
(58) Field of Classification Search ........... 438/424, 438/427, 430, 435, 453, 454
See application file for complete search history.

(56) References Cited

U.S. PATENT DOCUMENTS

| | | | |
|---|---|---|---|
| 4,256,514 A | 3/1981 | Pogge | |
| 5,157,003 A | 10/1992 | Tsuji et al. | |
| 6,207,534 B1 | 3/2001 | Chan et al. | |
| 2002/0022327 A1 | 2/2002 | Park | |
| 2004/0018704 A1 | 1/2004 | Colson et al. | |

FOREIGN PATENT DOCUMENTS

| | | |
|---|---|---|
| DE | 37 15 232 | 11/1988 |
| DE | 102 19 398 | 11/2003 |
| DE | 103 03 926 | 8/2004 |
| EP | 0 010 596 | 5/1980 |
| EP | 1 403 917 | 3/2004 |
| JP | 2-246330 | 10/1990 |
| JP | 03 163830 | 7/1991 |
| JP | 7-086390 | 3/1995 |
| JP | 9-069608 | 3/1997 |
| WO | WO 2005/069380 | 7/2005 |

*Primary Examiner* — Kevin M Picardat
(74) *Attorney, Agent, or Firm* — Cozen O'Connor

(57) ABSTRACT

A method, in which a first isolating trench, filled with a dielectric material, and a second conducting trench, filled with an electrically conductive material, can be produced. To this end, the first and second trenches are etched with different trench widths, so that the first trench is filled completely with the dielectric material after a deposition of a dielectric layer over the entire surface with the edges covered, whereas the wider second trench is covered by the dielectric layer only on the inside walls. By anisotropic back-etching of the dielectric layer, the semiconductor substrate is exposed at the bottom of the second trench. Subsequently, the second trench is filled with an electrically conductive material and then represents a low-ohmic connection from the substrate surface to the buried structure located below the second trench.

10 Claims, 9 Drawing Sheets

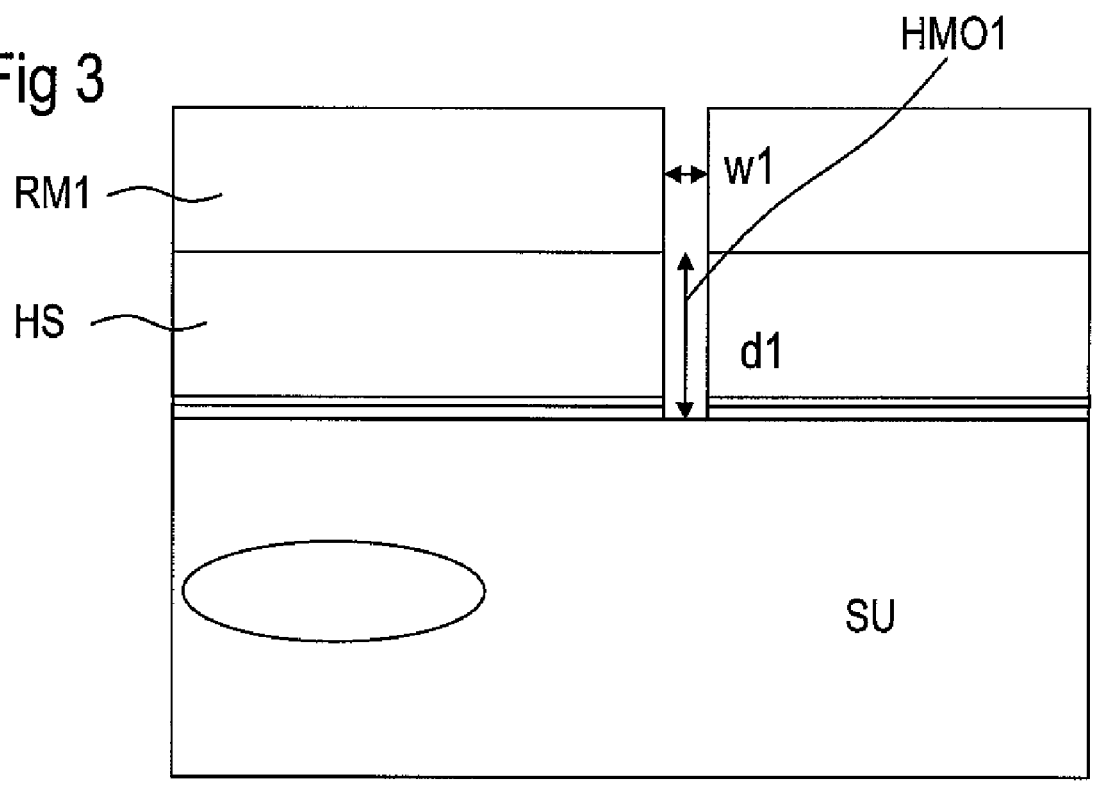
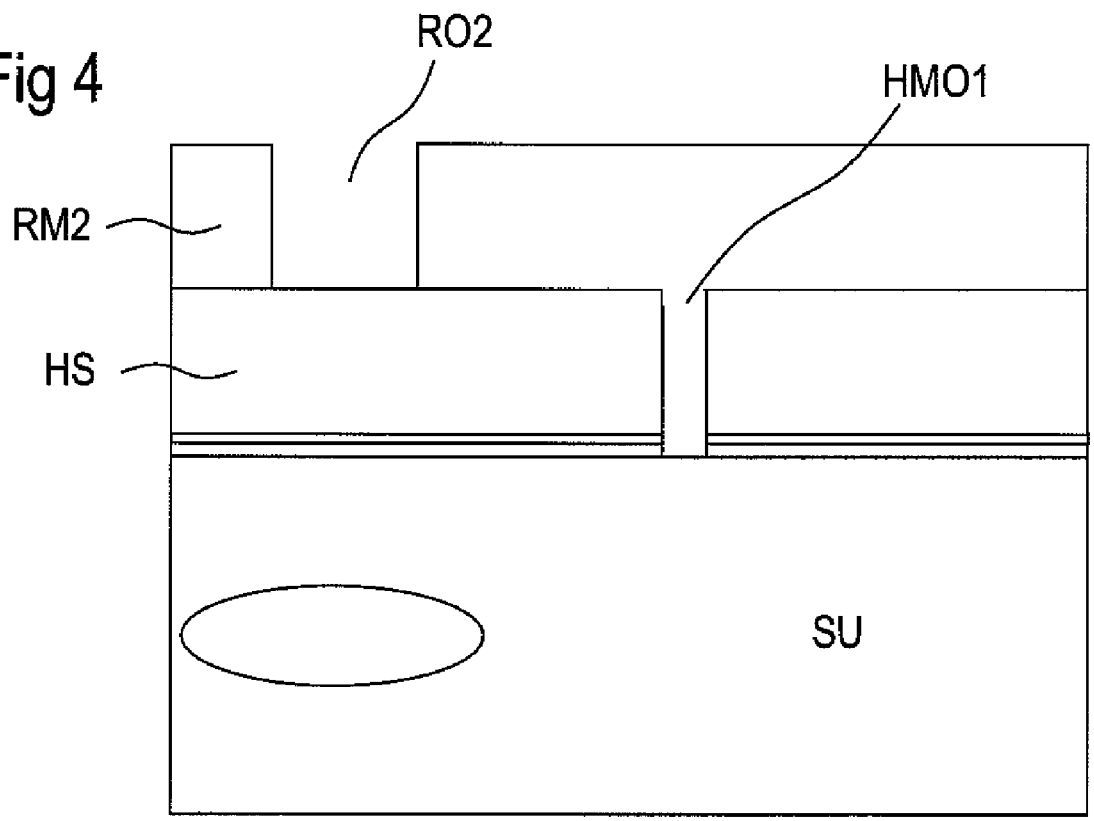

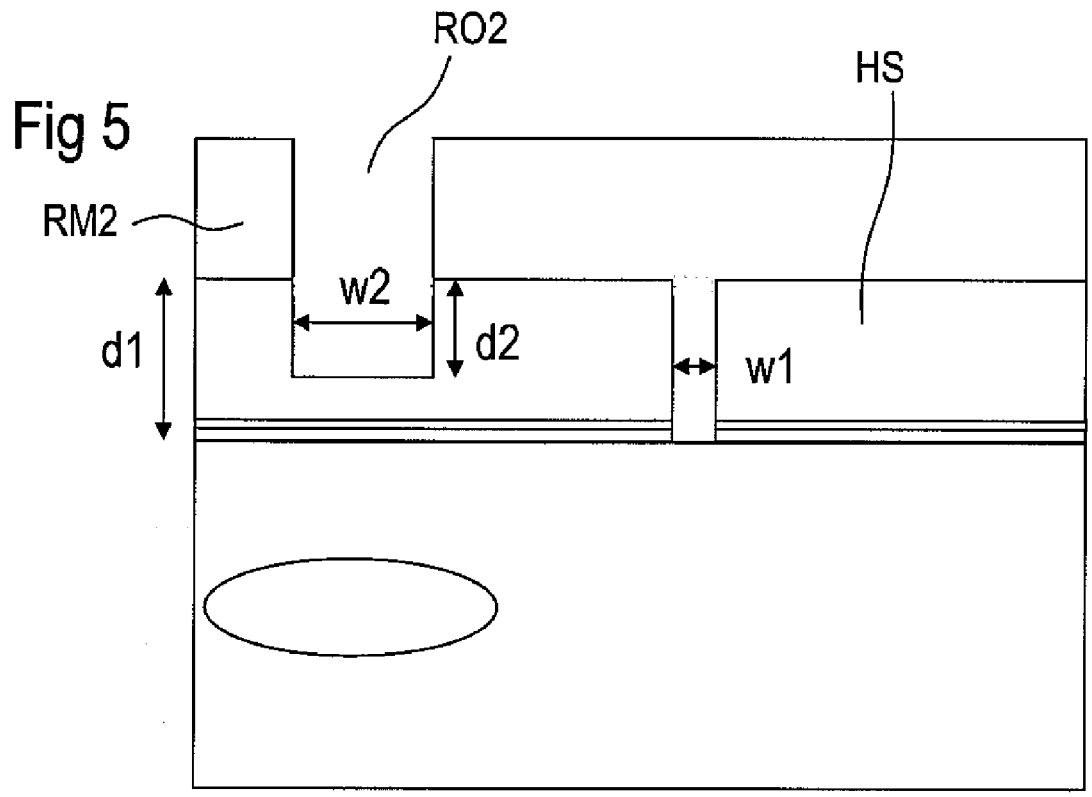
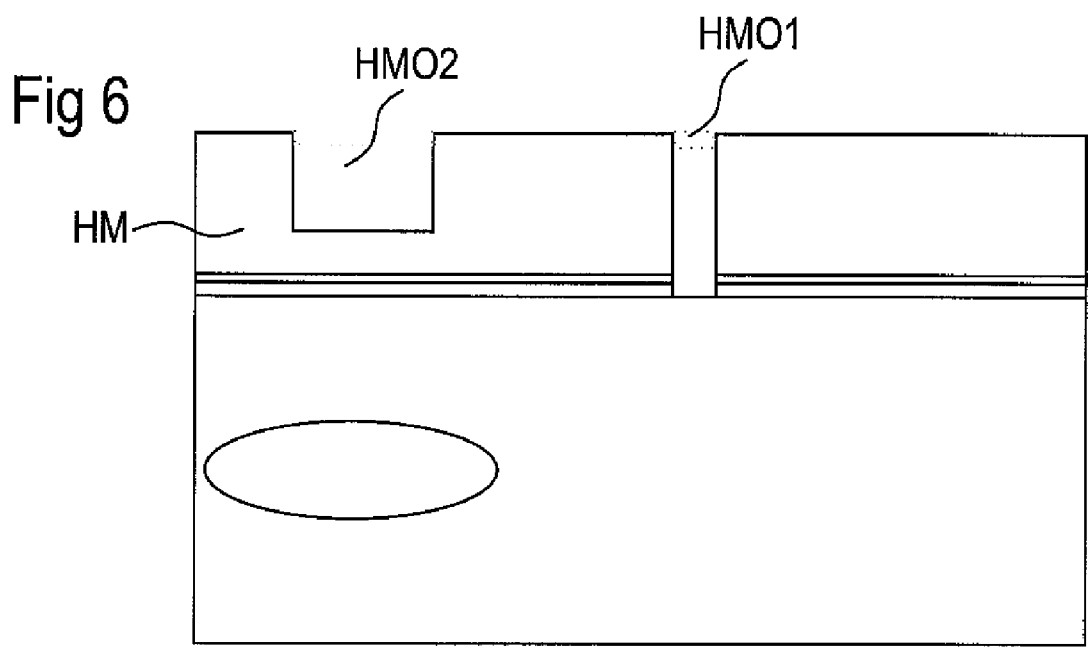

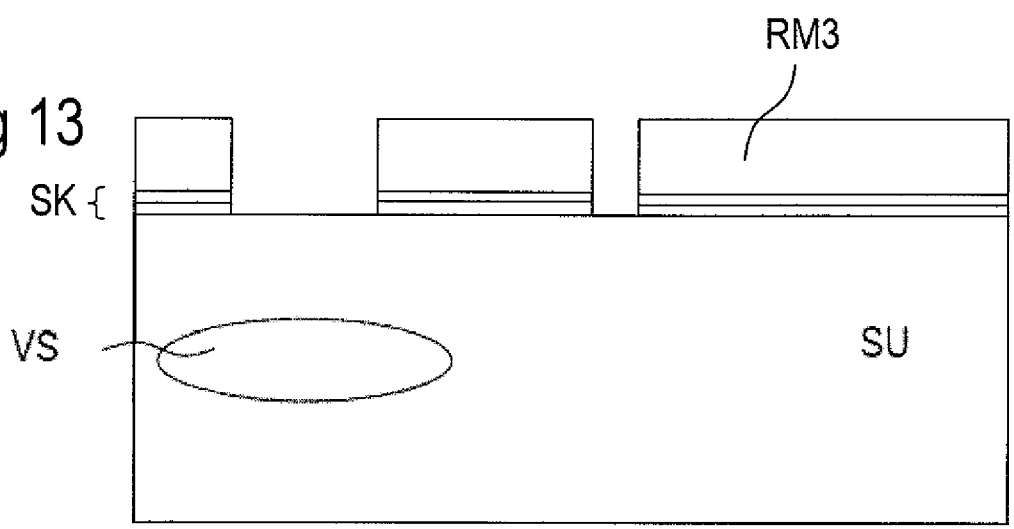
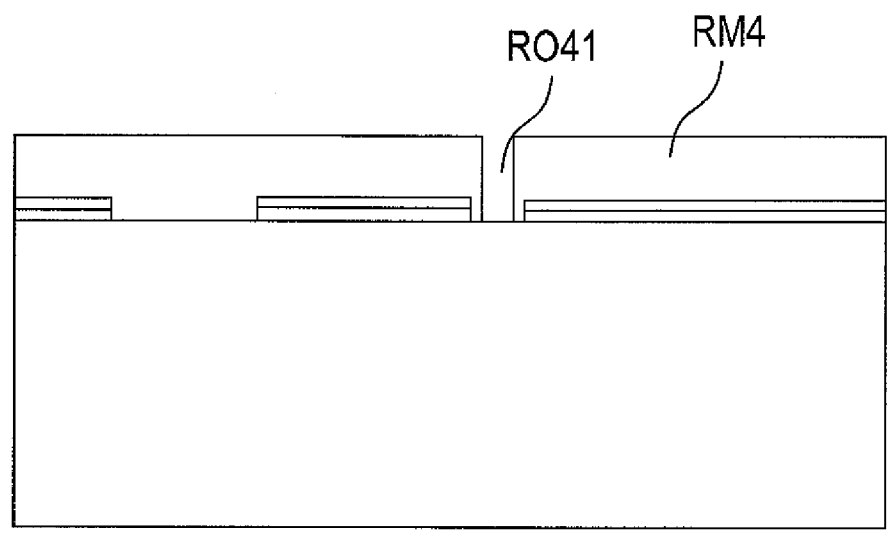
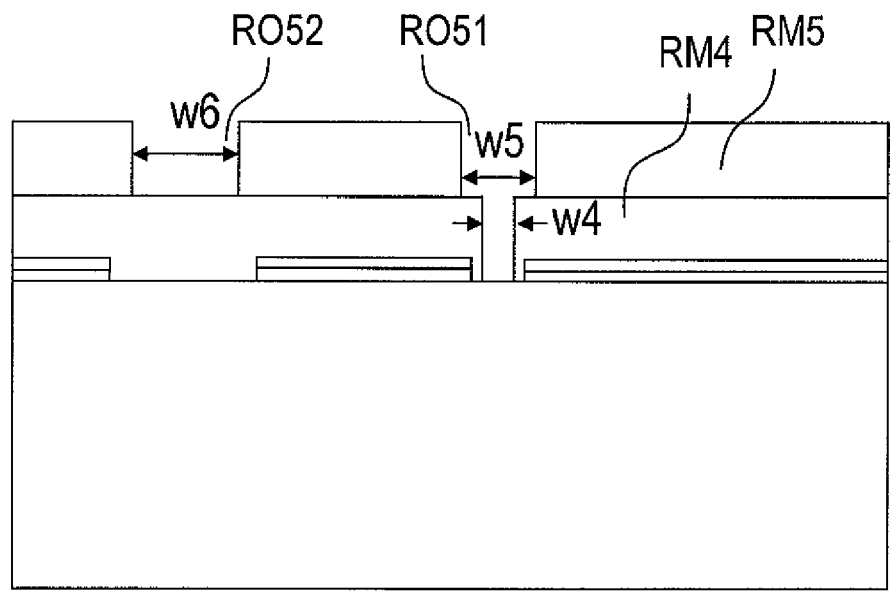

METHOD FOR PRODUCING A SEMICONDUCTOR COMPONENT WITH TWO TRENCHES

RELATED APPLICATIONS

This is a U.S. national stage under 35 USC §371 of application No. PCT/EP2007/061275, filed on Oct. 22, 2007.

This application claims the priority of German Patent Application No. 10 2006 054 334.3 filed Nov. 17, 2006 the entire content of which is hereby incorporated by reference.

BACKGROUND OF THE INVENTION

In semiconductor elements, it is possible to use buried, doped layers so as to connect vertically oriented components from "below." It is also possible to provide a buried layer for isolation or shielding purposes. In all cases, such a buried layer needs a contact with the surface, which is undertaken via a low-ohmic doping that extends to the buried layer.

Additionally to this, isolating trenches are needed in semiconductor elements, so as to isolate component structures from one another. Thus, for example, there is a need to isolate a buried layer that is correlated with a first component structure from a second semiconductor structure that is not in direct electrical connection with it; this may also be, for example, a buried layer. Such an isolating trench then requires a depth that surpasses that of the buried layer, so as to create a secure isolation with a high breakdown voltage.

From published US Patent Application US 2004/0018704A1, a method is known, with which a low-ohmic connection of one component surface can be produced from a component surface to a buried layer and simultaneously, an electric isolation between two sections of a buried layer. To this end, a trench to the buried layer is first etched and then a doping substance is introduced into the trench walls; this substance then creates low-ohmic contact structures there. In the following step, the trench is further etched to a desired depth required for the isolation, and the inside walls are finally coated with a dielectric.

Furthermore, the electric contacting of buried layers via so-called sinker dopings is known, which are created at a certain depth of the semiconductor substrate and by diffusion produce the low-ohmic zone for the contacting of the buried layer with the surface.

The contacting of a buried layer via a sinker contact has the disadvantage that while driving the doping to the desired depth, simultaneously a lateral diffusion takes place and the lateral expansion of the sinker contact is thus unnecessarily increased and an unnecessarily large amount of surface is taken up, which can no longer be used for other component structures.

SUMMARY OF THE INVENTION

One object of the present invention is to provide a method for the production of such a contact structure, which is compatible with other process steps used for the production of the component and therefore, the simultaneous production of other semiconductor structures of the semiconductor element is made possible.

The object of the present invention is therefore to indicate a method for the production of such a contact structure, which is compatible with other process steps used for the production of the component and therefore, the parallel production of other semiconductor structures of the semiconductor element is made possible.

A method is disclosed that makes possible the production in a common semiconductor substrate of a first trench filled with a dielectric and a second trench filled with a conductive material. To this end, the two trenches are first etched in the semiconductor substrate, wherein the second trench is produced with a larger width than the first trench. Subsequently, a dielectric is deposited on the entire surface with the edges covered, in such a thickness that the first trench is completely filled with the dielectric; the second trench with the larger width, however, still remains partially opened. Then the dielectric is anisotropically etched until the substrate is exposed on the bottom in the second trench, whereas the side walls remain covered by the oxide layer. Such an etching step is also known as spacer etching.

The production of both trenches is simplified with the simultaneous production of isolating and contacting trenches. The distinction between contacting and isolating trenches takes place on the basis of the process conditions alone through the corresponding selection of the trench width, which can be specified by lithography or also by self-adjusting structures.

It is advantageous to produce the first (isolating) trench with a depth $d4$ and the second (contacting) trench with a depth $d5$, wherein $d4$ is greater than $d5$ and thus the isolating trench extends to a greater depth than the contacting trench. In this manner, it is possible by means of the first trench to isolate the buried structure, which is contacted with the second trench, with respect to adjacent structure elements in the semiconductor element.

Advantageously, the depth $d4$ of the first trench is selected so large that the trench extends at least under the lower edge of the buried structure or the buried layer. The contacting second trench is advantageously produced so deep that it reaches the buried structure, but in no way does it completely go through it. It is also possible to produce the second trench at a depth $d5$ that is less than the upper edge of the buried structure and to produce the contact to the buried structure only by diffusion of a doping substance that is introduced into the trench via the conductive material.

The different depth of the two trenches can be attained with a two-part etching process, in which the first trench is first etched anisotropically to a first depth $d3$ in a first partial etching step. Subsequently, in a second partial etching step, the first trench is etched further to its final depth $d4$ and simultaneously, in the same step, the second trench is etched anisotropically to a depth $d5$. The depth of the first trench is thereby produced from the total depth of the trench structures produced in the two partial etching steps. The depth of the second trench is attained alone in the second partial etching step. The second partial etching step is therefore preferably carried out in such a way that the desired depth $d5$ of the second trench is attained.

The depth $d3$ of the first trench attained in the first partial etching corresponds thereby to the depth difference between the first and second trenches, and is selected in such a manner that the desired isolation or the desired breakdown voltage is attained between the component structures to be isolated by this trench.

The division of the trench etching process into two partial steps is done simply via a hard mask, which has first and second openings for the first and second trench. In the first opening, the substrate surface, that is, the semiconductor surface, is exposed. In the second opening, the thickness of the hard mask is reduced to a layer thickness $d2$; the other areas of the hard mask have the original layer thickness $d1$, with $d2<d1$.

With this hard mask, which has openings at different depths, the trenches are subsequently produced in an anisotropic etching process, wherein the depth difference of the two trenches is dependent on the residual thickness d2 of the hard mask in the second opening and the selectivity of the etching process or its etching rate ratio in the etching of the hard mask and the semiconductor material. The etching process is adjusted in such a manner that the etching rate of the hard mask is substantially smaller than the etching rate of the semiconductor material. Via a suitable dimensioning of the residual layer thickness d2 of the hard mask, therefore, it is possible to adjust the depth difference between the first and second trenches with a given selectivity of the etching process. The depth d3 corresponds thereby to the product from the residual thickness d2 and the corresponding etching rate ratio. With a given residual layer thickness d2 of the hard mask, one can of course also adjust the selectivity of the etching process, which, however, is expensive as a rule and not preferred.

The first and second trenches with different depths can also be produced in a second method variant, in which before the trench etching, a first and, above it, a second resist layer are produced and subsequently structured. In the first resist layer, only the openings are thereby provided for the first trench. In the second resist layer, openings for the first and second trenches are produced.

In a first etching step, the substrate is etched anisotropically and selectively with respect to the first and second resist layers, wherein the substrate, which is exposed only in the openings of the first resist layer, is etched in the area of the first trench to a first freely selectable depth d7. In the following step, the first resist layer is selectively etched with respect to the second resist layer, so as to also expose the semiconductor substrate in the area of the second openings in the first resist layer.

In the next step, the substrate is anisotropically and selectively etched with respect to the first resist layer, wherein the first trench is etched to its second and thus final depth d4 and the second trench to a depth d5. Before this step, it is possible to remove the second resist layer. All partial steps can be carried out without interruption in the same etching reactor, wherein the selectivity of the individual etching steps can be adjusted by a selection of corresponding etching conditions in the etching reactor, such as gas composition, pressure, and/or temperature.

For these methods, photoresist layers can be used as the first and second resist layers. For this, it is advantageous to use, as an anisotropic etching process, a chemically dominated plasma etching process, which includes ions that are reactive with respect to the material of the layer to be etched.

The anisotropy of this method can be enhanced in that, in the meantime, the plasma conditions are so varied that the deposition rate predominates, in comparison with the etching rate, and in this way, a passivation layer is deposited on all surfaces. In connection with the anisotropic etching process, the side wall above all is thus passivated and no longer attacked. A halogen-containing plasma, in particular a fluorine-containing plasma, is suitable for the etching process. The alternation between the etching conditions and the deposition conditions can be alternatingly carried out several times. This method can also be used to produce the openings in the first and/or second resist layers.

For this method, it is advantageous to cover the semiconductor substrate with a dielectric double layer consisting of an oxide layer and a nitride layer. This can be used as an etching stop, in a later method step. With the double layer, it is necessary to have another etching step, with which openings are created in this double layer, preceding the process. The width of the openings is selected larger in the double layer than the corresponding first and second openings for the first and second trenches in the first resist layer. This ensures that an underetching of the first resist layer that may appear does not lead to an underetching of the double layer. Accordingly, the mask layout, that is, the difference between the structure widths in the first resist layer relative to the structure widths of the openings in the double layer, is selected in accordance with the extent of underetching to be expected.

An underetching of the double layer is disadvantageous for the component.

In both method variants that are to be distinguished in principle, a dielectric, in particular a high-temperature oxide, is deposited after the etching of the two trenches to their final depth, which can be deposited with a good edge covering even at the bottom of trenches having a high aspect ratio.

Doped polysilicon, tungsten silicide, or any other conductive, trench-filling, depositable material is suitable as a conductive material for the filling of the contact trench (second trench). To this end also, a process is required that covers edges and also allows deposition on the bottom of a deep, second trench in such a way that the trench is completely filled without the formation of hollow spaces.

For the removal of the deposited conductive material, which is not used as trench filling, a back-etching or a planarizing, for example CMP (chemical mechanical polishing), can be used.

The back-etching is carried out until conductive material not deposited in the trench is completely removed from the surface.

BRIEF DESCRIPTION OF THE DRAWINGS

Below, the invention is explained in more detail in conjunction with embodiments and corresponding figures. These are drawn in a purely schematical manner and not true to scale.

FIGS. 2 to 12 show various method stages of a first embodiment;

FIGS. 13 to 22 show various method stages of a second embodiment.

DETAILED DESCRIPTION OF THE DRAWINGS

Figure 1:
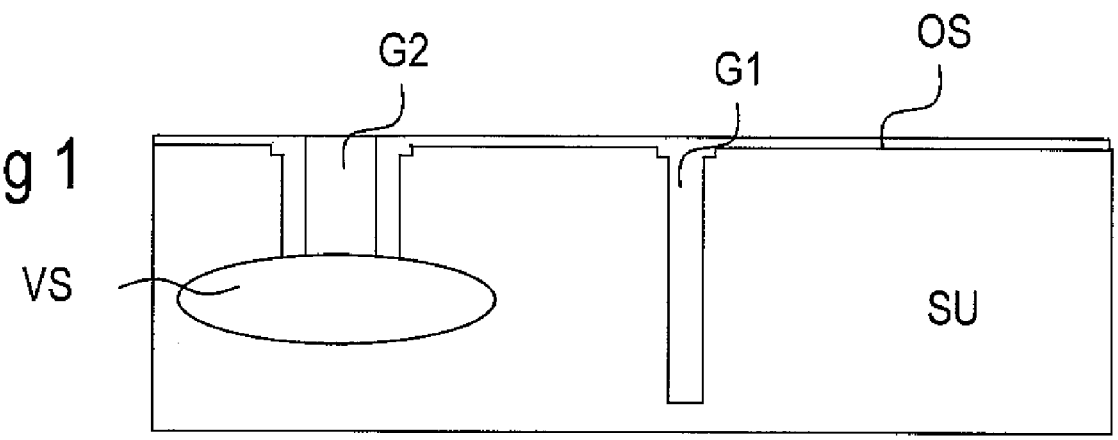
FIG. 1 shows a component after the filling of the trenches.

FIG. 1 shows in a schematic cross-section a component structure by way of example, as it can be produced with the disclosed method. This comprises a semiconductor substrate SU, in which a first trench G1 and a second trench G2 are produced at a distance from one another. The depth of the first trench is greater than the depth of the second trench. Whereas the first trench is filled with a dielectric, the second trench G2 is isolated on its side walls, relative to the substrate, and has a filling with a conductive material, which, on its lower end, contacts a buried structure VS, for example a buried layer. The surface of the substrate SU can be covered with an oxide layer OS.

Figure 2:
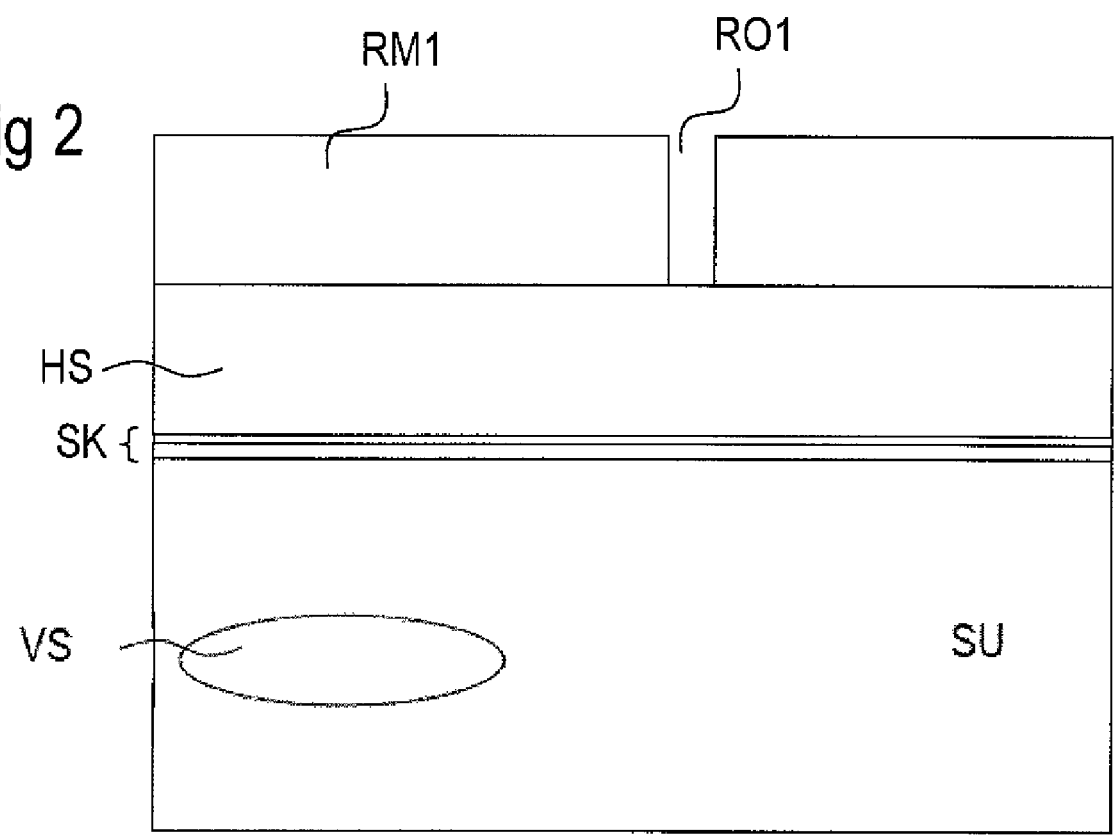

In a first embodiment, one begins with a semiconductor substrate SU, in which a buried structure VS is provided at a distance to the surface. The buried structure VS can, for example, be produced in the surface of a wafer and covered with an epitaxial layer. A dielectric layer combination SK of thin dielectric layers, which may be an oxide layer and a nitride layer, for example, is located on the semiconductor substrate (FIG. 2); they can be used as protective layers and etching stop layers. A hard mask layer HS, an oxide layer, for example, is produced over this, covering the entire surface. In the first step, a mask opening of the hard mask is then produced for the first trench, in that a correspondingly structured first resist mask RM1 is produced, which has a resist opening R01, as shown in FIG. 2, in the area of the first trench.

In the next step, the structure of the first resist mask is transferred to the hard mask layer HS by means of an anisotropic etching process. The dielectric layer combination SK can be used as an etching stop. Subsequently, the dielectric layer combination SK on the bottom of the trench can be removed. FIG. 3 shows the arrangement with the first hard mask opening HM01, which has a width w1 and a depth d1.

In the next step, the hard mask opening for the second trench is produced, in that a second resist mask RM2 is placed and correspondingly structured (FIG. 4). The second resist opening R02 in the area of the second trench is transferred to the hard mask layer HS by means of an anisotropic etching process. The etching is carried out, while being controlled by its duration, for example, in such a manner that the second mask opening HM02 is produced only to a depth d2<d1 and a residual layer thickness of the hard mask remains on the bottom of the second hard mask opening. FIG. 5 shows the arrangement after the production of the hard mask opening and FIG. 6 after the removal of the second resist mask RM2. There, the finished hard mask HM is also shown with first and second hard mask openings HM01, HM02. The second hard mask opening has a width w2, which is larger than the width w1 of the first hard mask opening.

Figure 7:
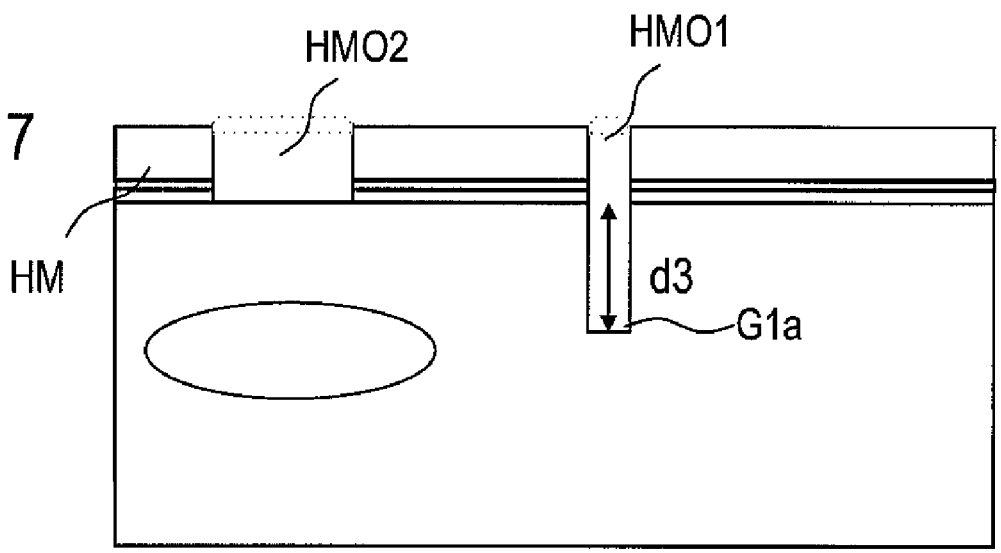

In the next step, a first partial etching into the semiconductor substrate is carried out by means of an anisotropic etching process, a physically dominated plasma etching process, for example. In the area of the first mask opening HM01, a first partial trench G1a with a depth d3 is thereby produced. As a result of the not one-hundred-percent selectivity of the etching process used, the hard mask layer is eroded in the area of the second hard mask opening HM02, until either the layer combination SK used as the etching stop layer or the surface of the substrate SU is exposed. FIG. 7 shows the arrangement at this process stage.

Figure 8:
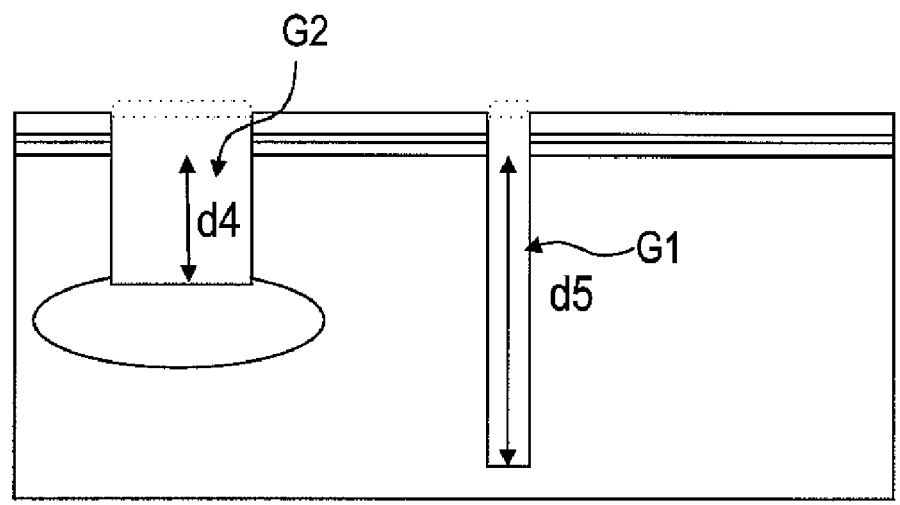

In the next step, a second partial etching process into the semiconductor substrate SU is carried out, wherein the first trench G1 is etched to its final depth d5 and the second trench G2 to a depth d4. FIG. 8 shows the arrangement at this process stage.

In the next step, optionally a channel stop doping is carried out in the trench walls and, in particular, in the trench bottom. The purpose of this is to inhibit the generation of an inversion layer along the inside walls of the trench and thus to increase the threshold voltage of the generation of parasitic conductive areas. The doping of the substrate is preferably increased thereby.

Figure 9:
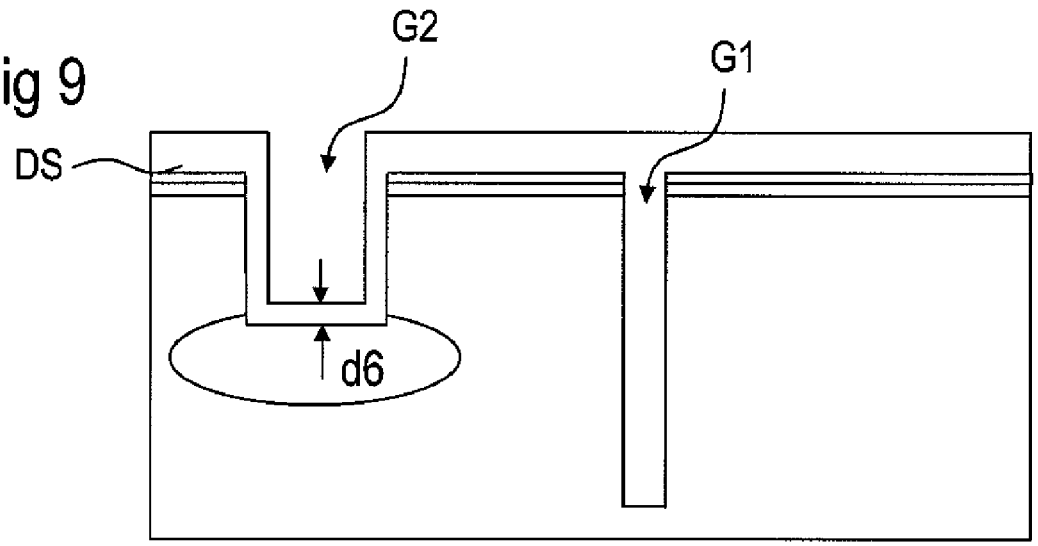

In the next step, an edge-covering, trench-filling, dielectric layer DS, a high-temperature oxide, for example, is deposited on the entire surface. This is produced in a layer thickness that corresponds to at least half the width (w1)/2 of the first trench and therefore leads to the complete filling of the first trench with the dielectric layer. In the area of the second trench, the dielectric layer produces only a covering of the trench walls and the trench bottom, on which it is deposited in a layer thickness d6. FIG. 9 shows the arrangement at this process stage.

Figure 10:
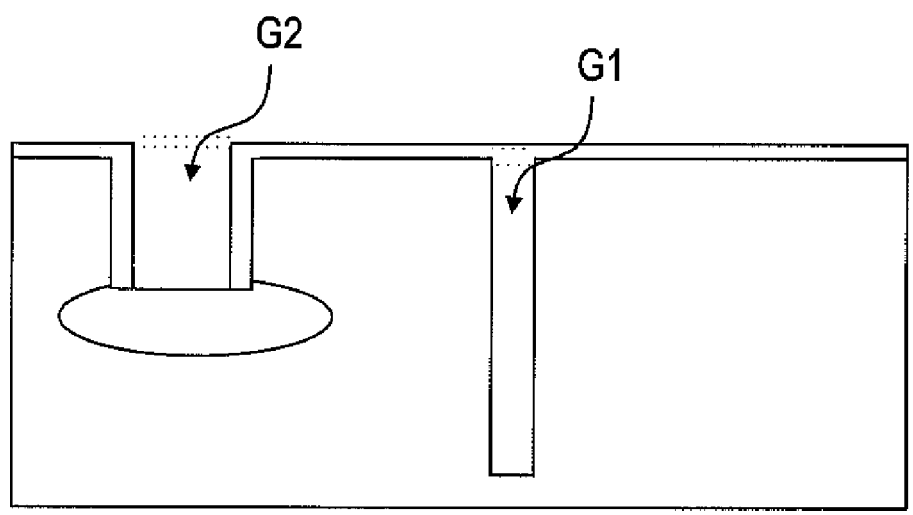

In the next step, the dielectric layer DS is etched back in an anisotropic etching process, similar to a spacer etching, until the dielectric layer DS is completely removed at the bottom of the second trench G2. The dielectric layer combination serves as an etching stop layer on the surface of the semiconductor substrate. The side walls of the second trench G2 remain covered by the dielectric layer DS; likewise, the first trench remains filled with the dielectric material. FIG. 10 shows the arrangement after the removal of the silicon nitride layer, which forms the topmost layer of the dielectric layer combination.

Figure 11:
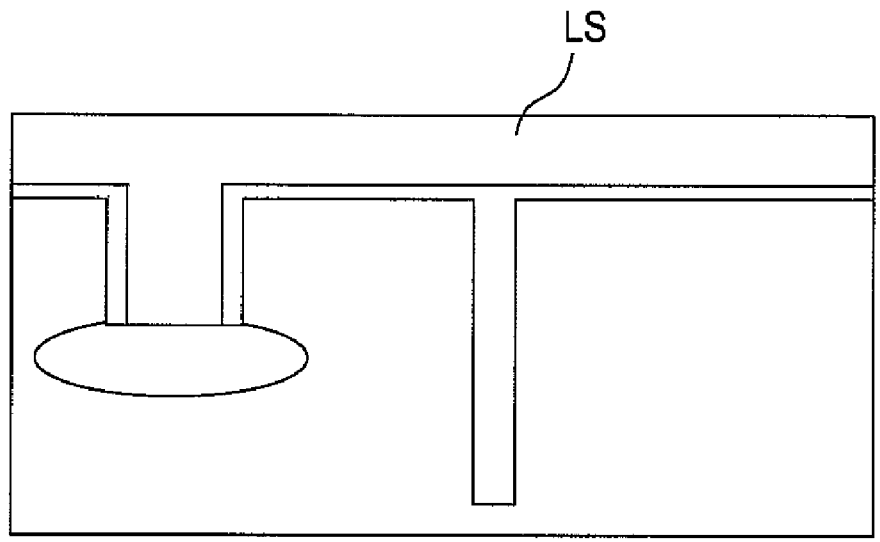

In the next step, the second trench is filled with a conductive material, in that a conductive material is deposited, covering the edges of the trench (formed between the upper, horizontal surface of the substrate and the sidewall of the trench), in a layer thickness that corresponds at least to half the trench width (w2)/2 of the first trench. FIG. 11 schematically shows the arrangement at this process stage.

In the next stage, the conductive layer LS is anisotropically etched back so that the conductive material LM remains exclusively in the area of the first trench, as the trench filling; in the rest of the surface area, however, the lower partial layer of the dielectric layer combination, usually an oxide layer, remains.

Figure 12:
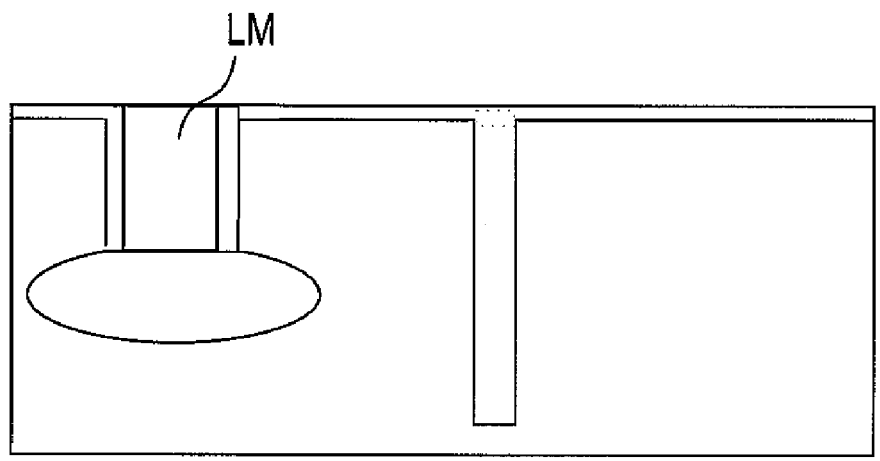

FIG. 12 shows the arrangement at this process stage, which corresponds to the structure shown in FIG. 1.

Below, the production of the trench structure is described in more detail in accordance with a second embodiment. One begins, as before, with a substrate SU with a buried structure VS, having a surface that is covered by a dielectric layer combination SK. Appropriate openings are etched in the layer combination SK in the area of the first and second trenches, by means of a third resist mask RM3. FIG. 13 shows the arrangement at this process stage.

In the next step, the third resist mask RM3 is removed and a fourth resist mask RM4 is placed and structured. To this end, an opening, having a width that is smaller than the width of the opening produced in the dielectric layer combination, is produced in the area of the first trench. The fourth resist mask RM4 remains unstructured in the area of the later second trench (FIG. 14).

In the next step, the structured, fourth resist mask is hardened in its structure, which can take place, for example, by treatment with UV radiation and by a tempering step, depending on the resist material used. In the next step, then, a fifth resist mask RM5 is produced in that a resist layer is placed and correspondingly structured. In the fifth resist mask RM5, openings are produced in the area of the first and second trenches. The width w5 of the first resist opening R051 (opening for the first trench in the fifth resist mask) is larger than the width w4 of the corresponding opening in the fourth resist mask RM4 lying underneath. The fifth resist mask RM5 can be structured similar to the third resist mask in FIG. 13. Correspondingly, the opening R051 produced therein can be aligned with the edges of the openings in the dielectric layer combination SK. FIG. 15 shows the arrangement at this process stage.

Figure 16:
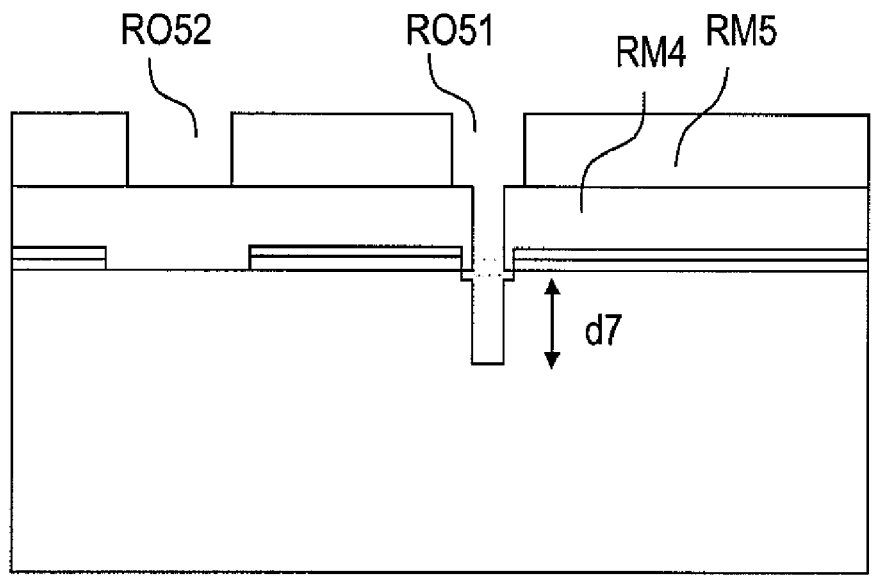

In the next step, a first partial trench is etched in the silicon substrate to a depth d7, using an anisotropic etching process, which etches the semiconductor material of the substrate selectively to the material of the fourth and fifth resist masks RM4, RM5. To this end, a chemically dominated plasma etching process is used, which is adjusted by varying the plasma conditions in at least one time section in such a way that a material deposition and, in particular, the deposition of a passivation on the trench walls takes place, which increases the selectivity and the anisotropy of the process. FIG. 16 shows the arrangement after the creation of the first partial trench of a depth d7.

Figure 17:
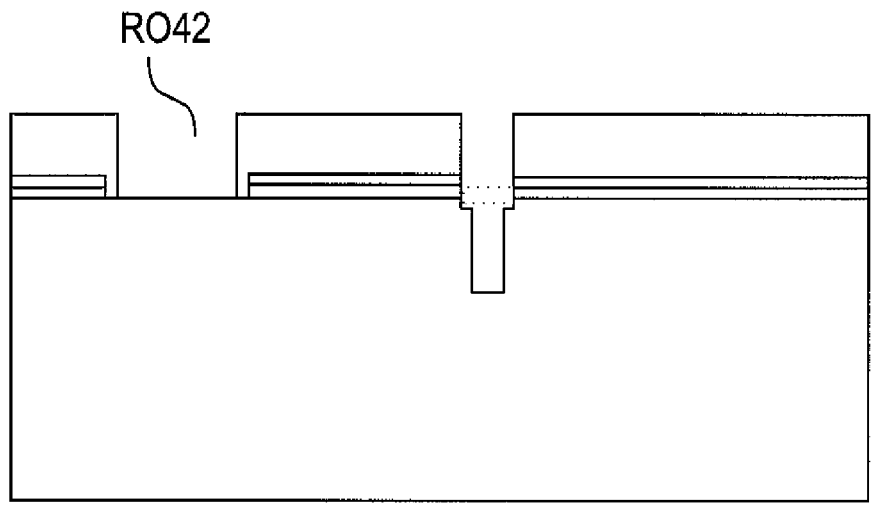

In the next step, the structure of the fifth resist mask RM5 is transferred to the fourth resist mask, wherein in the corresponding openings, the material of the fourth resist mask is removed. The structure shown in FIG. 17 thereby arises; it now also has a second resist opening R042, in the area of the second trench, in which the surface of the substrate is exposed.

Figure 18:
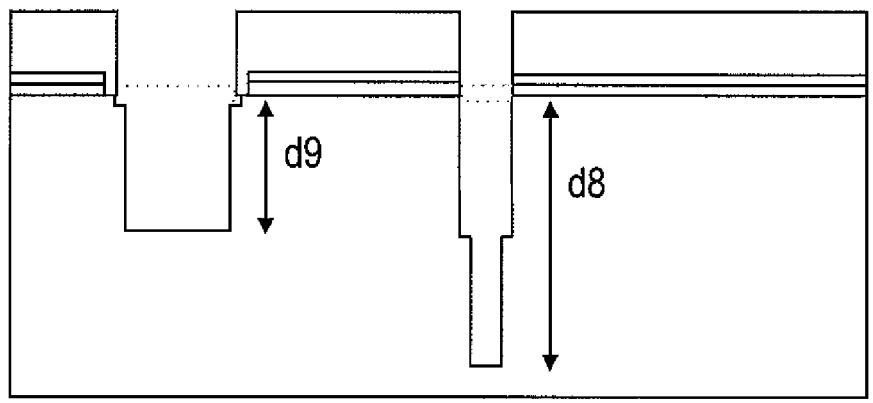

In the next step, in turn, the semiconductor substrate is etched selectively to the fourth resist mask RM4, wherein the same etching conditions as in the first partial etching step can be established. The first trench is deepened to a final depth d8, whereas the second trench is etched to a depth d9. FIG. 18 shows the arrangement at this process step.

Figure 19:
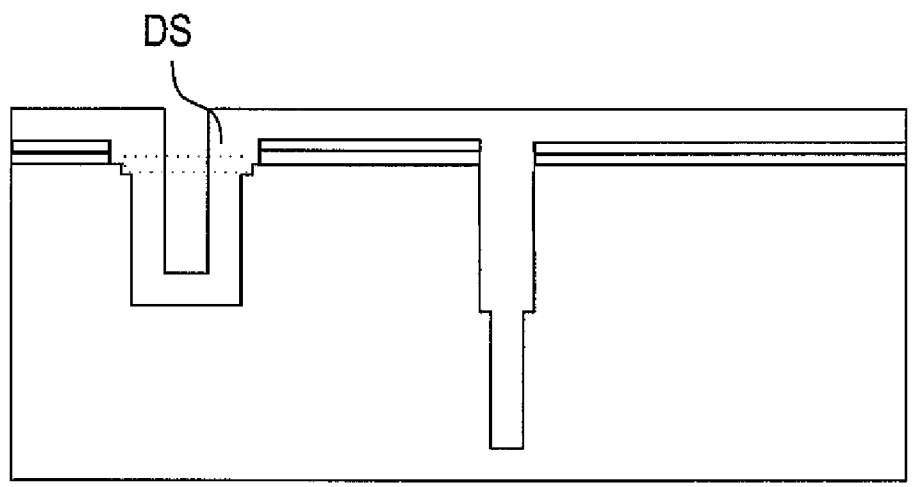

In the next step, an edge-covering dielectric layer DS is deposited over the entire area in a layer thickness that is suitable for the complete filling of the first trench and which, in the second trench, covers the side walls and the bottom, but leaves a free space in the middle. FIG. 19 shows the arrangement at this process stage.

Figure 20:
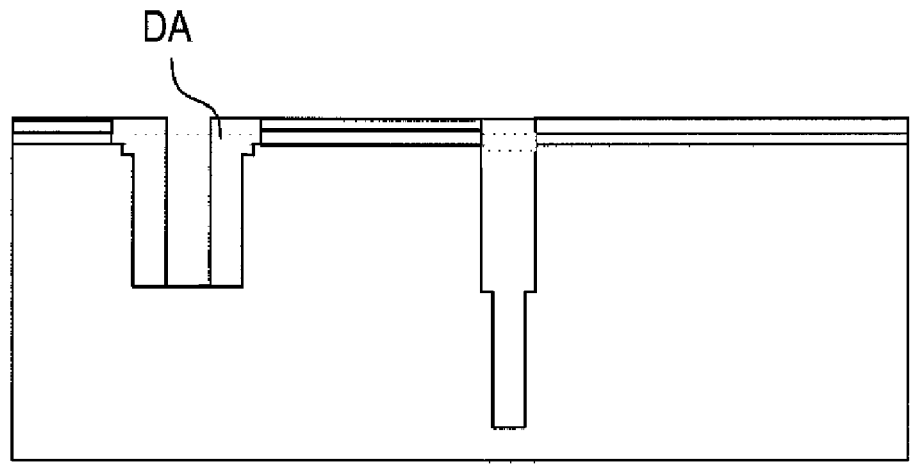

In the next step, the further procedure can be as described in conjunction with FIGS. 10 to 12 for the first embodiment. An anisotropic spacer etching process follows, in which the layer thickness of the dielectric layer DS is removed until the surface of the semiconductor substrate is exposed on the bottom of the second trench. The dielectric layer combination SK can be used as an etching stop in the area of the remaining surface. FIG. 20 shows the arrangement at this process step.

Figure 21:
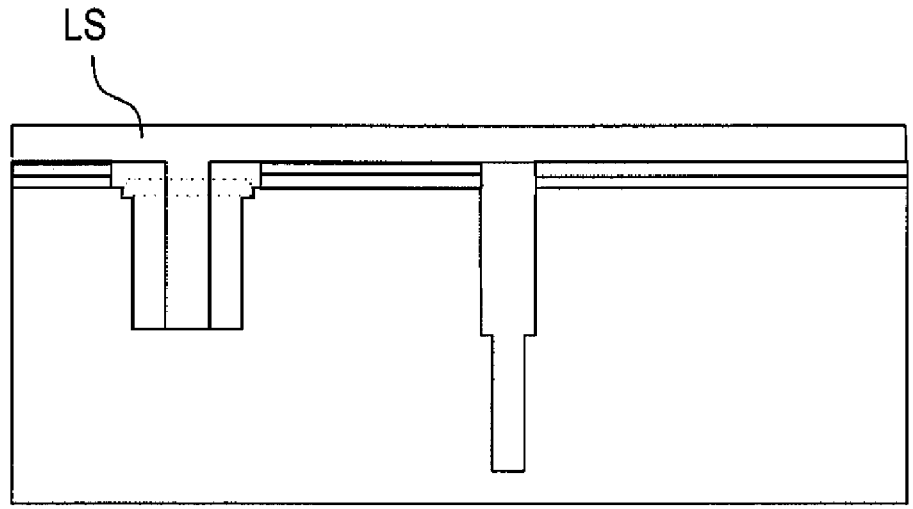

In the next step, a conductive material LS is deposited over the entire area, in a manner covering the edges and filling the trenches, until the second trench is completely filled. FIG. 21 shows the arrangement at this process stage.

Figure 22:
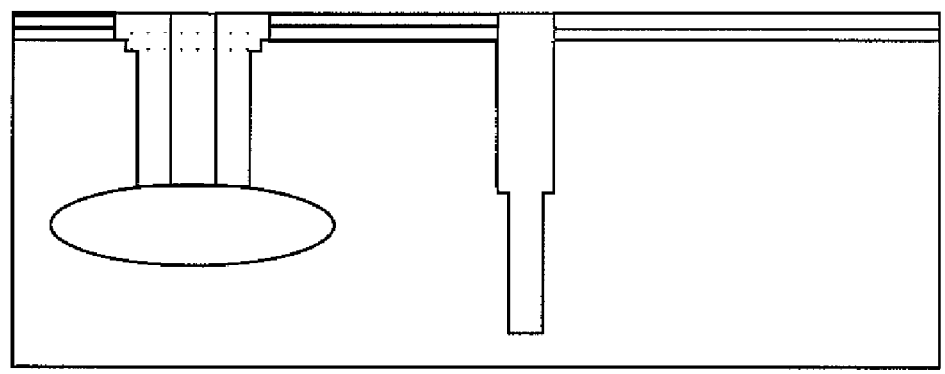

In the next step, the layer of the conductive material is etched back, or the arrangement is planarized, until all of the conductive material outside the second trench is removed. FIG. 22 shows the arrangement at this process stage, which corresponds to the possible final structure shown in FIG. 1.

The advantage of this second variant is to be found in that the etching process can be carried out substantially faster than in the first variant.

The structure of the fourth and fifth resist masks is selected in such a manner as to compensate for an erosion of the fourth and fifth resist masks by the etchant as well as to provide, afterwards, still a sufficient reserve projecting over the edges of the dielectric layer combination, so as to compensate for an underetching of the fourth resist mask, which starts at the beginning of the etching process, and thereby, however, to avoid an underetching under the dielectric layer combination SK, as can be seen, for example, with the aid of FIG. 16.

At the beginning of the second partial etching step, as, for example, shown in FIG. 18, underetching no longer takes place because of the passivation within the first trench. The underetching in the area of the second trench is also compensated by a corresponding structure layout of the fifth resist mask there, so that the underetching does here not reach below the dielectric layer combination either. As a result of the materials used and the increased etching speed, the second process variant can furthermore be carried out at a lower cost.

The result, however, is that both variants lead to the simultaneous production of the first and second trenches at different depths, wherein the difference in depth can be adjusted in the desired manner. Thus, the first trench completely filled with dielectric can be selected so deep that it comes to lie below the deepest electrically conductive structure (here: buried structure VS) of the semiconductor component and therefore reliably isolates it from neighboring component areas with electrically conductive component structures. Also, the depth of the second trench can be established in a controlled manner with the second partial etching step, so that in the first trench, it is precisely the upper edge of the buried structure VS that is exposed. The electrically conductive material LM deposited in the trenches makes the second trench a low-ohmic connection to the buried structure, which can thus be contacted electrically via the conductive material in the second trench.

The invention is not limited to the embodiments that are explained and represented in the figures. Rather, the two trenches can be produced with other mask combinations and other etching processes. A large number of first and second trenches can also be produced simultaneously, corresponding to a corresponding number of structure elements to be isolated or buried structures to be contacted.

A buried structure VS is preferably used with high-volt components and can be present there at a depth d9 or d4 of circa 10 µm. The depth d8 or d5 of the first trench to be sufficient to isolate the buried structure electrically with respect to adjacent buried structures, it may exceed the depth d9 or d4 of the second trench by 50 percent, for example. The width w2 of the second trench corresponds to at least twice the layer thickness of the dielectric layer DS plus a reserve of circa 1 µm, which guarantees that the trench remains free. In this way, at least a clear trench width of circa 1 µm remains after the deposition of the dielectric layer; it is suitable, after filling with conductive material, for the production of a sufficiently low-ohmic connection to the buried structure. The width of the first trench is selected correspondingly smaller than twice the layer thickness of the dielectric layer, that is, for example, smaller than 2 µm with a layer thickness of the dielectric layer of circa 1 µm.

A trench is understood to mean round or rectangular recesses as well as long-extended trench-like structures. In particular, the first trench can have an extension vertical to the represented plane of the drawings, which exceeds its width several times. In this way, large-surface structures can also be successfully isolated with such a trench, with respect to adjacent structures.

The second trench can, on the other hand, have a round or square cross-section, or also one formed differently, wherein, preferably, the length and width of the trench opening do not differ too much. It is also possible to contact a buried structure by means of several second trenches that are arranged next to one another.

The invention is suitable, in particular, for high-volt transistors that require an increased electric isolation, which can be guaranteed with the invention in a simple and low-cost manner.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples

The invention claimed is:

1. A method for the production of a semiconductor component with a first and a second trench in a substrate comprising a semiconductor, in which the first trench is filled with a dielectric and in which the second trench is filled with a conductive material to form an electric contact to a buried structure, the method comprising the steps of:
   (a) first, producing the first and second trenches in the semiconductor substrate, the first trench being produced with a width w1, and the second trench being produced with a width w2, with w2>w1;
   (b) subsequently, depositing a dielectric over an entire surface and with edge covering, in a thickness such that the first trench is completely filled with the dielectric, and such that the second trench remains partially opened;

(c) subsequently, etching the dielectric anisotropically until substrate at a bottom of the second trench is freely exposed; and (d) subsequently, depositing an electrically conductive material over the entire surface and with edge covering until the second trench is filled;

wherein the first trench is produced in step (a) with a depth $d5$ and the second trench is produced with a depth $d4$, with $d5>d4$, so as to isolate the buried structure contacted by the second trench, with respect to adjacent structural elements of components.

2. The method according to claim 1, wherein different depths of the first and second trenches are attained by a process in which the first trench is initially etched anisotropically to a first depth $d3$, in which, subsequently, in a joint step, the first trench is further etched anisotropically to its final depth $d5$ and, simultaneously, the second trench is etched to the depth $d4$.

3. The method according to claim 2, wherein a hard mask of thickness $d1$ is placed on the substrate which, after a structuring in an area of the first trench, includes an opening with a substrate surface exposed therein, and in an area of the second trench, a reduced layer thickness;

wherein the first and second trenches are subsequently produced with an anisotropic etching process which, for the substrate, includes an etching speed that is substantially higher in comparison to an etching speed of the hard mask; and wherein the different depths of the first and second trenches are adjusted by a suitable dimensioning of the reduced layer thickness relative to a selectivity of the anisotropic etching process.

4. The method according to claim 1, wherein for step (d), a silicide or doped silicon is deposited as the electrically conductive material and, subsequently, a conductive layer, deposited over the entire surface, is back-etched or planarized until the conductive material is removed from all surfaces and remains only as a filling in the second trench.

5. A method for the production of a semiconductor component with a first and a second trench in a substrate comprising a semiconductor, in which the first trench is filled with a dielectric and in which the second trench is filled with a conductive material to form an electric contact to a buried structure, the method comprising the steps of:

(a) first, producing the first and second trenches in the semiconductor substrate, the first trench being produced with a width $w1$, and the second trench being produced with a width $w2$, with $w2>w1$;

(b) subsequently, depositing a dielectric over an entire surface and with edge covering, in a thickness such that the first trench is completely filled with the dielectric, and such that the second trench remains partially opened;

(c) subsequently, etching the dielectric anisotropically until substrate at a bottom of the second trench is freely exposed;

(d) subsequently, depositing an electrically conductive material over the entire surface and with edge covering until the second trench is filled;

(e) producing and subsequently structuring a first resist layer and, over the first resist layer, a second resist layer, an opening being produced in the first resist layer for the first trench, and openings being produced in the second resist layer for the first and second trenches;

(f) etching the semiconductor substrate anisotropically and selectively relative to the first and second resist layers, the first trench being produced to a first depth $d7$;

(g) etching the first resist layer anisotropically relative to the second resist layer until the semiconductor substrate is exposed in an opening of the first resist layer provided for the second trench; and (h) etching the semiconductor substrate anisotropically and selectively relative to the first resist layer, the first trench being etched to a second and final depth $d5$, and the second trench being etched to a depth $d4$.

6. The method according to claim 5, wherein for the etching of the semiconductor substrate in steps (f) and (h), a chemically dominated plasma etching process is used.

7. The method according to claim 6, wherein during ion etching, at least one of a pressure and gas composition of the chemically dominated plasma is changed, alternatingly, such that anisotropic etching and deposition of a passivation layer alternate with one another.

8. The method according to claim 5, wherein steps (g) and (h) are performed in the same reactor.

9. The method according to claim 5, wherein the semiconductor substrate is covered with a dielectric oxide/nitride double layer, into which, before step (e), openings having a width that is greater than those of corresponding openings in the first resist layer are etched with another resist mask in an area of the first and second trenches.

10. The method according to claim 9, wherein the openings in the second resist layer are produced wider than the openings in the first resist layer.

* * * * *